(12) United States Patent
Liu et al.

(10) Patent No.: US 8,003,994 B2
(45) Date of Patent: Aug. 23, 2011

(54) VERTICAL LED WITH CURRENT GUIDING STRUCTURE

(75) Inventors: Wen-Huang Liu, Hsinchu County (TW); Chen-Fu Chu, Hsinchu (TW); Jiunn-Yi Chu, Chubei (TW); Chao-Chen Cheng, Hsinchu (TW); Hao-Chun Cheng, Donggang Township, Pingtung County (TW); Feng-Hsu Fan, Jhonghe (TW); Yuan-Hsiao Chang, Daya Township, Taichung County (TW)

(73) Assignee: SemiLEDs Optoelectronics Co., Ltd, Chu-nan (TW)

( * ) Notice: Subject to any disclaimer, the term of this patent is extended or adjusted under 35 U.S.C. 154(b) by 0 days.

(21) Appl. No.: 12/823,866

(22) Filed: Jun. 25, 2010

(65) Prior Publication Data
US 2010/0258834 A1    Oct. 14, 2010

Related U.S. Application Data

(62) Division of application No. 12/136,547, filed on Jun. 10, 2008, now Pat. No. 7,759,670.

(60) Provisional application No. 60/943,533, filed on Jun. 12, 2007.

(51) Int. Cl.
| | |
|---|---|
| *H01L 29/06* | (2006.01) |
| *H01L 31/0328* | (2006.01) |
| *H01L 31/0336* | (2006.01) |
| *H01L 31/072* | (2006.01) |
| *H01L 31/109* | (2006.01) |
| *H01L 27/15* | (2006.01) |
| *H01L 29/26* | (2006.01) |
| *H01L 31/12* | (2006.01) |
| *H01L 33/00* | (2006.01) |
| *H01L 29/22* | (2006.01) |

(52) U.S. Cl. ........ 257/79; 257/13; 257/94; 257/E33.001; 257/E33.002; 257/E33.012; 257/E33.062

(58) Field of Classification Search .................... 257/13, 257/79, 94, E33.001, E33.002, E33.012, 257/E33.062
See application file for complete search history.

(56) References Cited

U.S. PATENT DOCUMENTS

| | | | |
|---|---|---|---|
| 4,344,984 A | 8/1982 | Kaplan et al. | |
| 5,300,791 A | 4/1994 | Chen et al. | |
| 5,376,580 A | 12/1994 | Kish et al. | |
| 5,502,316 A | 3/1996 | Kish et al. | |
| 6,998,642 B2 * | 2/2006 | Lin et al. | 257/79 |
| 7,095,765 B2 | 8/2006 | Liu et al. | |
| 7,288,797 B2 * | 10/2007 | Deguchi et al. | 257/99 |
| 7,301,175 B2 * | 11/2007 | Izuno et al. | 257/98 |
| 7,514,720 B2 | 4/2009 | Kim et al. | |
| 7,679,097 B2 * | 3/2010 | Akaishi | 257/99 |
| 7,829,909 B2 * | 11/2010 | Yoo | 257/99 |
| 2003/0141506 A1 | 7/2003 | Sano et al. | |
| 2005/0017254 A1 | 1/2005 | Lin et al. | |
| 2006/0006402 A1 | 1/2006 | Hsieh et al. | |
| 2006/0043384 A1 | 3/2006 | Cho et al. | |
| 2006/0050755 A1 * | 3/2006 | Suzuki et al. | 372/50.121 |

(Continued)

*Primary Examiner* — Ida M Soward
(74) *Attorney, Agent, or Firm* — Patterson & Sheridan, L.L.P.

(57) ABSTRACT

Techniques for controlling current flow in semiconductor devices, such as LEDs are provided. For some embodiments, a current guiding structure may be provided including adjacent high and low contact areas. For some embodiments, a second current path (in addition to a current path between an n-contact pad and a metal alloy substrate) may be provided. For some embodiments, both a current guiding structure and second current path may be provided.

27 Claims, 10 Drawing Sheets

U.S. PATENT DOCUMENTS

| | | |
|---|---|---|
| 2006/0081857 A1 | 4/2006 | Hong et al. |
| 2006/0154393 A1* | 7/2006 | Doan et al. .................. 438/26 |
| 2006/0246617 A1 | 11/2006 | Lee et al. |
| 2006/0289894 A1 | 12/2006 | Murata et al. |
| 2007/0166851 A1* | 7/2007 | Tran et al. .................. 438/22 |
| 2007/0181895 A1* | 8/2007 | Nagai .................. 257/98 |
| 2007/0212854 A1 | 9/2007 | Chu et al. |
| 2007/0221944 A1* | 9/2007 | Cheol Yoo .................. 257/99 |
| 2008/0296609 A1* | 12/2008 | Nagahama et al. .......... 257/103 |
| 2010/0207145 A1* | 8/2010 | Yoo .................. 257/98 |

* cited by examiner

VERTICAL LED WITH CURRENT GUIDING STRUCTURE

CROSS-REFERENCE TO RELATED APPLICATION

This application is a divisional of U.S. patent application Ser. No. 12/136,547 filed Jun. 10, 2008, now U.S. Pat. No. 7,759,670 which claims benefit of U.S. Patent Application Ser. No. 60/943,533 filed Jun. 12, 2007, both of which are incorporated herein by reference in its entirety.

BACKGROUND OF THE INVENTION

1. Field of the Invention

Embodiments of the present invention generally relate to semiconductor processing and, more particularly, to forming light-emitting diode (LED) structures.

2. Description of the Related Art

During the fabrication of light-emitting diodes (LEDs), an epitaxial structure of an "LED stack" including layers of p-doped GaN and n-doped GaN, for example, may be formed. FIG. 1 illustrates such an example of a conventional LED device 102, having an n-doped layer 106 and a p-doped layer 110 separated by a multi-quantum well (MQW) layer 108. The device 102 is typically deposited on a carrier/growth-supporting substrate (not shown) of suitable material, such as c-plane silicon carbide (SiC) or c-plane sapphire, and bonded via a bonding layer 204 to a thermally and electrically conductive substrate 101. A reflective layer 202 may enhance brightness. Voltage may be applied between the n-doped layer 106 and p-doped layer 110 via an n-electrode 117 and the conductive substrate 101, respectively.

In some cases, it may be desirable to control the amount of current through the n-electrode 117 to the substrate 101, for example, to limit power consumption and/or prevent damage to the device 102. Therefore, an electrically insulative layer 206 may be formed below the p-doped layer 110, in the reflective layer 202, to increase contact resistance below the n-electrode 117 and block current. The insulative layer 206 may be similar to the current-blocking layer described in *Photonics Spectra*, December 1991, pp. 64-66 by H. Kaplan. In U.S. Pat. No. 5,376,580, entitled "Wafer Bonding of Light Emitting Diode Layers," Kish et al. teach etching a patterned semiconductor wafer to form a depression and bonding the wafer to a separate LED structure such that the depression creates a cavity in the combined structure. When the combined structure is forward biased by applying voltage, current will flow in the LED structure, but no current will flow through the cavity or to the region directly beneath the cavity since air is an electrical insulator. Thus, the air cavity acts as another type of current-blocking structure.

Unfortunately, these approaches to current-guiding have a number of disadvantages. For example, the electrically insulative layer 206, the air cavity, and other conventional current-blocking structures may limit thermal conductivity, which may increase operating temperature and compromise device reliability and/or lifetime.

Furthermore, a conventional LED device, such as the device 102 of FIG. 1, may be susceptible to damage from electrostatic discharge (ESD) and other high voltage transients. ESD spikes may occur, for example, during handling of the device whether in fabrication of the LED device itself, in shipping, or in placement on a printed circuit board (PCB) or other suitable mounting surface for electrical connection. Overvoltage transients may occur during electrical operation of the LED device. Such high voltage transients may damage the semiconductor layers of the device and may even lead to device failure, thereby decreasing the lifetime and the reliability of LED devices.

Accordingly, what is needed is an improved technique for guiding current through an LED device.

SUMMARY OF THE INVENTION

Embodiments of the present invention generally provide techniques and devices for guiding current in semiconductor devices, such as light-emitting diodes (LEDs).

One embodiment of the present invention provides an LED. The LED generally includes a metal substrate; an LED stack for emitting light disposed above the metal substrate, wherein the LED stack comprises a p-type semiconductor layer and an n-type semiconductor layer; an n-electrode disposed above the n-type semiconductor layer; and an electrically conductive material coupled between the metal substrate and the n-type semiconductor layer and forming a non-ohmic contact with the n-type semiconductor layer.

Another embodiment of the present invention provides an LED. The LED generally includes a metal substrate; an LED stack for emitting light disposed above the metal substrate, wherein the LED stack comprises a p-type semiconductor layer and an n-type semiconductor layer; an n-electrode disposed above the n-type semiconductor layer; a protective device disposed above the n-type semiconductor; and an electrically conductive material coupled between the metal substrate and the protective device.

Yet another embodiment of the present invention provides an LED. The LED generally includes a metal substrate; a p-electrode disposed above the metal substrate and having first and second contacts, wherein the first contact has a higher electrical resistance than the second contact; an LED stack for emitting light disposed above the p-electrode, wherein the LED stack comprises a p-type semiconductor layer coupled to the p-electrode and an n-type semiconductor layer; and an n-electrode disposed above the n-type semiconductor layer.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the present invention generally provide techniques for controlling current flow through a semiconductor device, such as a light-emitting diode (LED). The control may be via a current guiding structure, a second current path, or a combination thereof.

Hereinafter, relative terms such as "above," "below," "adjacent," "underneath," are for convenience of description and are typically not intended to require a particular orientation.

An Exemplary Current Guiding Structure

Figure 2:
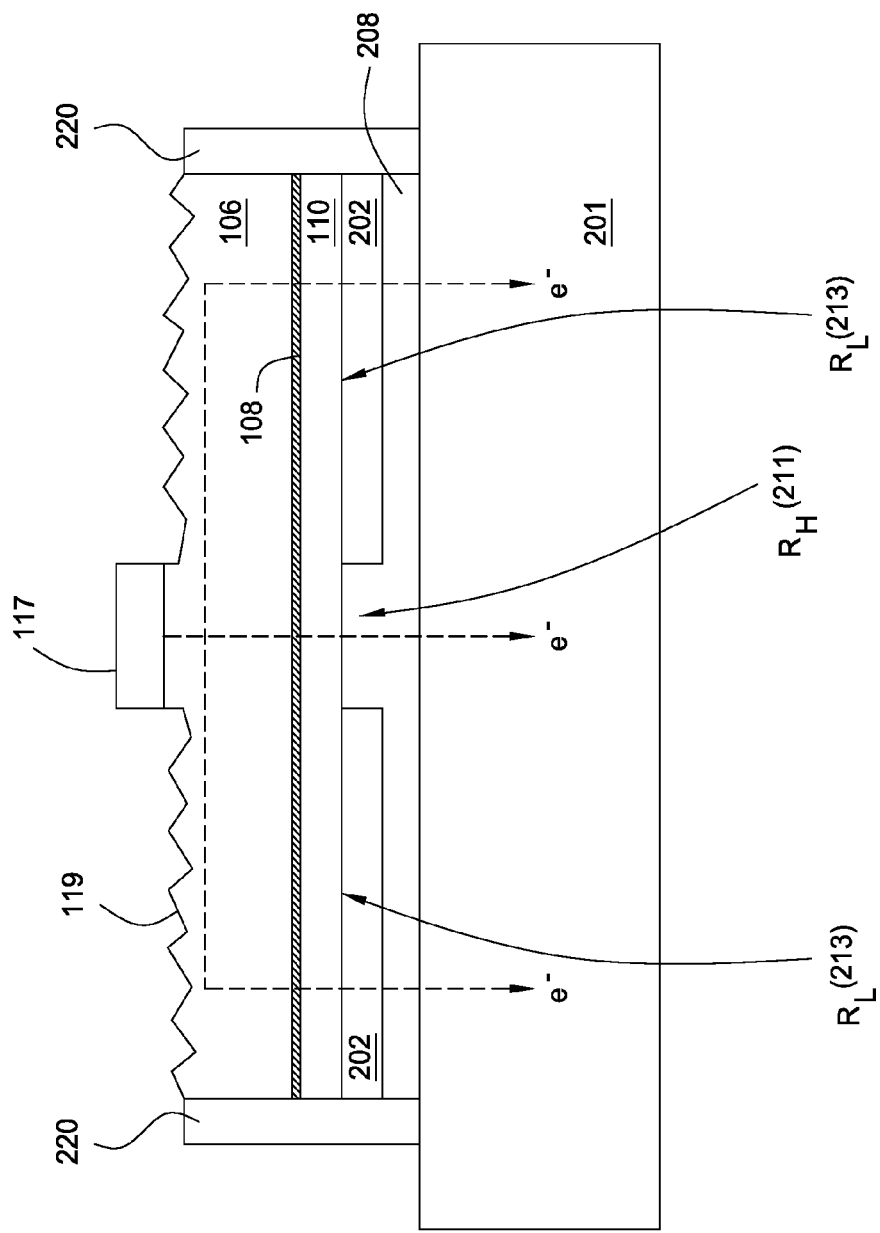
FIG. 2 illustrates an example LED device with a current guiding structure in accordance with embodiments of the present invention.

FIG. 2 illustrates an example light-emitting diode (LED) device with a current guiding structure in accordance with embodiments of the present invention. The device may include a device structure known as an LED stack comprising any suitable semiconductor material for emitting light, such as AlInGaN. The LED stack may include a heterojunction composed of a p-type semiconductor layer 110, an active layer 108 for emitting light, and an n-type semiconductor layer 106. The LED stack may have a top surface 119, which may be roughened as shown in FIG. 2. The LED device may comprise an n-electrode 117 formed on the top surface 119, the n-electrode 117 being electrically coupled to the n-type semiconductor layer 106, and a p-electrode (a reflective layer 202 and a barrier metal layer 208 may function as the p-electrode) on the p-type semiconductor layer 110.

Disposed adjacent to the p-type layer 110 may be a reflective layer 202 interjected by a barrier metal layer 208 forming low contact resistance areas 213 and a high contact resistance area 211, respectively. For some embodiments, the volume of the low contact resistance area 213 is larger than the high contact resistance area 211. Electrically conductive, but having a higher electrical resistance than the low contact resistance area 213, the high resistance contact area 211 may be formed utilizing a metallic material, as described below. The use and careful manipulation of areas with different levels of contact resistance may serve to direct the current to emit light from the active layer in desired areas, such as light emission mainly from the active layer in areas that are not disposed underneath the n-electrode 117 for enhanced light emission.

Figure 1:
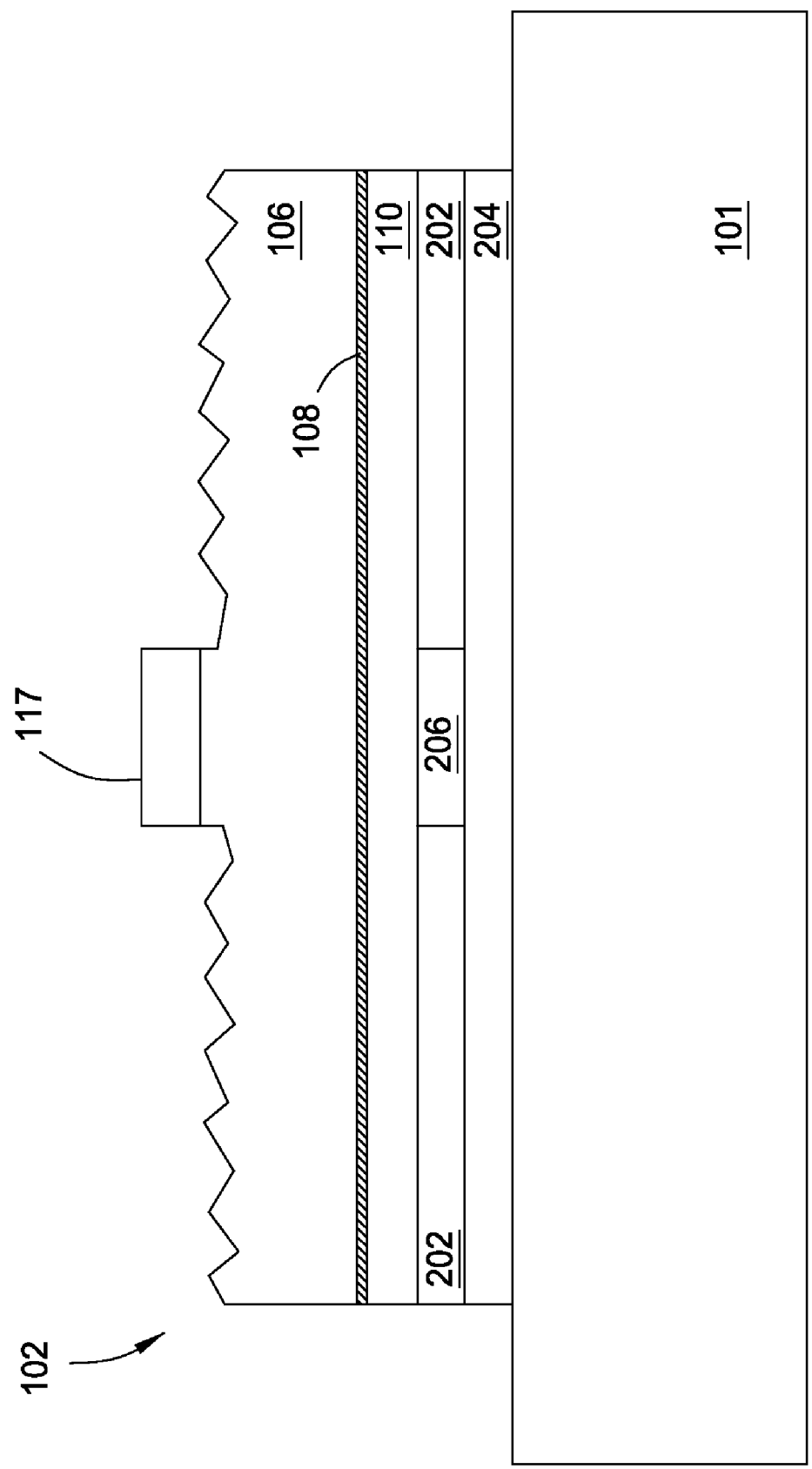
FIG. 1 illustrates a prior art example light-emitting diode (LED) device with a current guiding structure.

In this manner, the LED device of FIG. 2 with the fully electrically conductive current-guiding structure may have greater thermal conductivity when compared to traditional LED devices with conventional current-blocking or other current-guiding structures, such as the LED device of FIG. 1 with an electrically insulative layer 206. Therefore, the LED device of FIG. 2 and other embodiments of the present disclosure with an electrically conductive current-guiding structure may enjoy decreased operating temperature and increased device reliability and/or lifetime when compared to such traditional LED devices.

Figure 3:
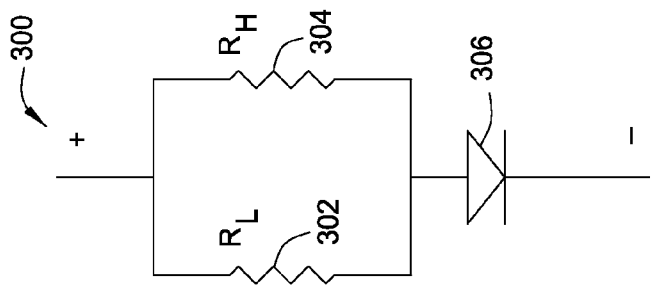
FIG. 3 illustrates an equivalent circuit to the LED device of FIG. 2.

FIG. 3 illustrates an equivalent circuit 300 for the LED device of FIG. 2. As illustrated, the equivalent circuit 300 includes resistors $R_L$ 302 and $R_H$ 304 in parallel that model the equivalent resistances of the high and low resistance contact areas 211, 213 of FIG. 2. Although only one resistor is shown for the low contact resistance area 213, this resistor $R_L$ 302 may represent the lumped equivalent of one or more parallel low contact resistance areas, such as the two areas 213 shown in FIG. 2. In a similar manner, the resistor $R_H$ 304 may represent the lumped equivalent of one or more parallel high contact resistance areas 211. For some embodiments, the equivalent high contact resistance may be at least two times the equivalent low contact resistance. As illustrated, the parallel resistors, $R_L$ 302 and $R_H$ 304, are in series with a diode 306 representing an ideal LED with no series resistance.

One or more layers of a metal or metal alloy substrate 201 may be disposed adjacent to the p-electrode (composed of the reflective layer 202 and the barrier metal layer 208 in FIG. 2). The conductive substrate 201 may be a single layer or multiple layers comprising metal or metal alloys, such as Cu, Ni, Ag, Au, Al, Cu—Co, Ni—Co, Cu—W, Cu—Mo, Ge, Ni/Cu, and Ni/Cu—Mo. The thickness of the conductive substrate 201 may range from about 10 to 400 μm. The conductive substrate 201 may be deposited using any suitable thin film deposition technique, such as electrochemical deposition (ECD), electroless chemical deposition (Eless CD), chemical vapor deposition (CVD), metal organic CVD (MOCVD), and physical vapor deposition (PVD). For some embodiments, a seed metal layer may be deposited using electroless chemical deposition, and then one or more additional metal layers of the conductive substrate 201 may be deposited above the seed metal layer using electroplating.

The reflective layer 202 may comprise a single layer or multiple layers comprising any suitable material for reflecting light and having a relatively low electrical resistance compared to materials used to create the high contact resistance area(s) 211. For example, the reflective layer 202 may comprise material such as silver (Ag), gold (Au), aluminum (Al), Ag—Al, silver (Ag), gold (Au), aluminum (Al), Ag—Al, Mg/Ag, Mg/Ag/Ni/, Mg/Ag/Ni/Au, AgNi, Ni/Ag/Ni/Au, Ag/Ni/Au, Ag/Ti/Ni/Au, Ti/Al, Ni/Al, AuBe, AuGe, AuPd, AuPt, AuZn, or using an alloy containing Ag, Au, Al, nickel (Ni), chromium (Cr), magnesium (Mg), platinum (Pt), palladium (Pd), rhodium (Rh), or copper (Cu).

For some embodiments, the low contact resistance area(s) 213 may comprise an omni-directional reflective (ODR) system. An ODR may comprise a conductive transparent layer, composed of such materials as indium tin oxide (ITO) or indium zinc oxide (IZO), and a reflective layer. The ODR may be interjected by a current blocking structure or other suitable structure in an effort to direct the current. An exemplary ODR system is disclosed in commonly-owned U.S. patent application Ser. No. 11/682,780, entitled "Vertical Light-Emitting Diode Structure with Omni-Directional Reflector" and filed on Mar. 6, 2007, herein incorporated by reference in its entirety.

The n-electrode 117 (also known as a contact pad or n-pad) may be a single metal layer or multiple metal layers composed of any suitable material for electrical conductivity, such as Cr/Au, Cr/Al, Cr/Al, Cr/Pt/Au, Cr/Ni/Au, Cr/Al/Pt/Au, Cr/Al/Ni/Au, Ti/Al, Ti/Au, Ti/Al/Pt/Au, Ti/Al/Ni/Au, Al, Al/Pt/Au, Al/Pt/Al, Al/Ni/Au, Al/Ni/Al, Al/W/Al, Al/W/Au, Al/TaN/Al, Al/TaN/Au, Al/Mo/Au. The thickness of the n-electrode 117 may be about 0.1~50 μm. The n-electrode 117 may be formed by deposition, sputtering, evaporation, electroplating, electroless plating, coating, and/or printing on the top surface 119 of the LED stack.

The barrier metal layer 208 may be a single layer or multiple layers comprising any suitable material for forming the high contact resistance area(s) 211. For example, the barrier metal layer 208 may comprise materials such as Ag, Au, Al, molybdenum (Mo), titanium (Ti), hafnium (Hf), germanium (Ge), Mg, zinc (Zn), Ni, Pt, tantalum (Ta), tungsten (W), W—Si, W/Au, Ni/Cu, Ta/Au, Ni/Au, Pt/Au, Ti/Au, Cr/Au, Ti/Al, Ni/Al, Cr/Al, AuGe, AuZn, Ti/Ni/Au, W—Si/Au, Cr/W/Au, Cr/Ni/Au, Cr/W—Si/Au, Cr/Pt/Au, Ti/Pt/Au, Ta/Pt/Au, indium tin oxide (ITO), and indium zinc oxide (IZO).

As illustrated in FIG. 2, protective layers 220 may be formed adjacent to the lateral surfaces of the LED device. These protective layers 220 may serve as passivation layers in an effort to protect the LED device, and especially the heterojunction, from electrical and chemical conditions in the environment.

The high and low contact resistance areas may be formed, for example, by depositing one or more layers serving as the reflective layer 202 by any suitable process, such as electrochemical deposition or electroless chemical deposition. Areas designated for high contact resistance areas 211 may be removed in the reflective layer 202 by any suitable process, such as wet etching or dry etching. Following removal of the designated areas, a barrier metal layer 208 may be formed in the voided spaces within the reflective layer 202. For some embodiments as illustrated in FIG. 2, the barrier metal layer 208 composing the high contact resistance area(s) 211 may fill in the voided spaces within the reflective layer 202 and cover the reflective layer.

For some embodiments, the LED stack top surface 119 may be patterned or roughened to increase light extraction when compared to LED stacks with a smooth top surface. The top surface 119 may be patterned or roughened using any suitable technique (e.g., wet or dry etching).

Figure 6:
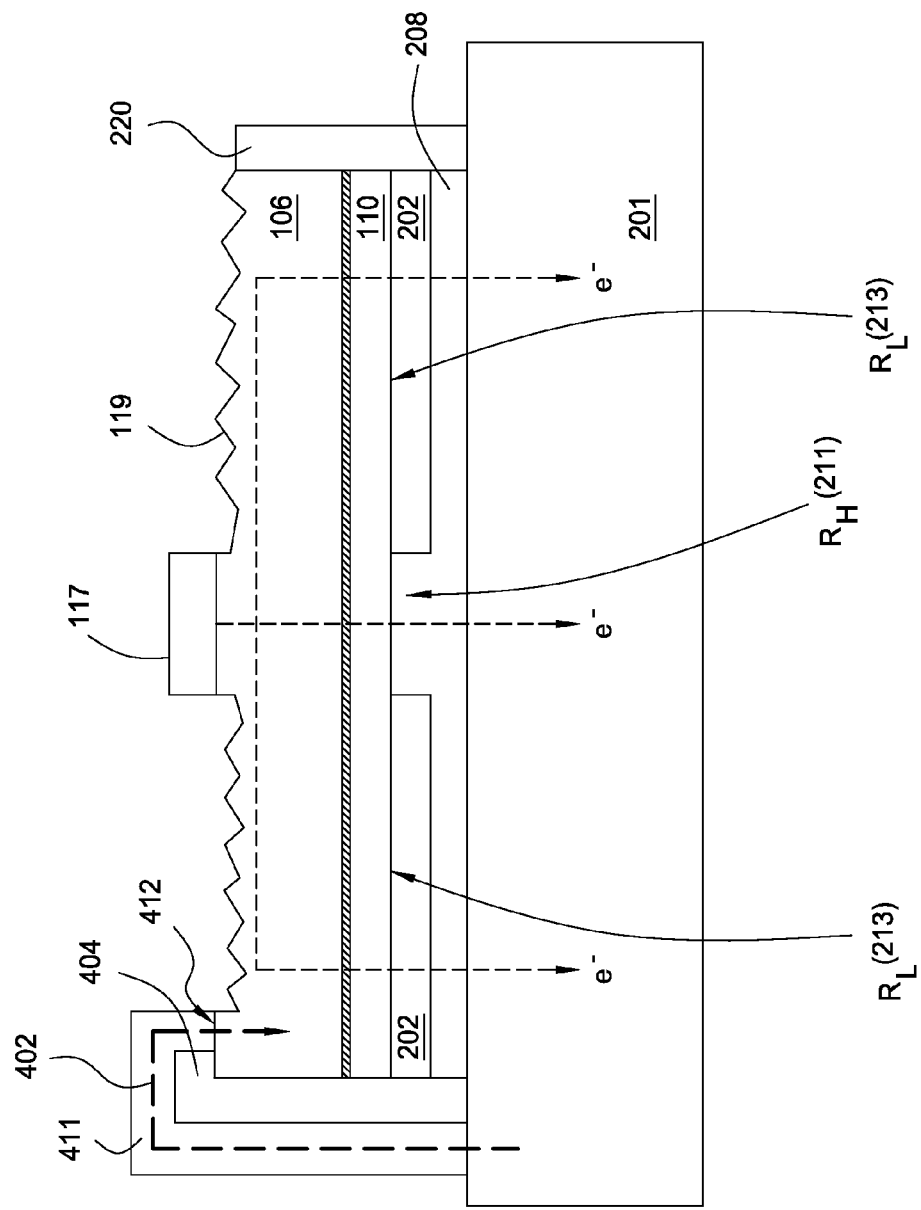
FIG. 6 illustrates an example LED device with a current guiding structure and a second current path in accordance with embodiments of the present invention.
Figure 9:
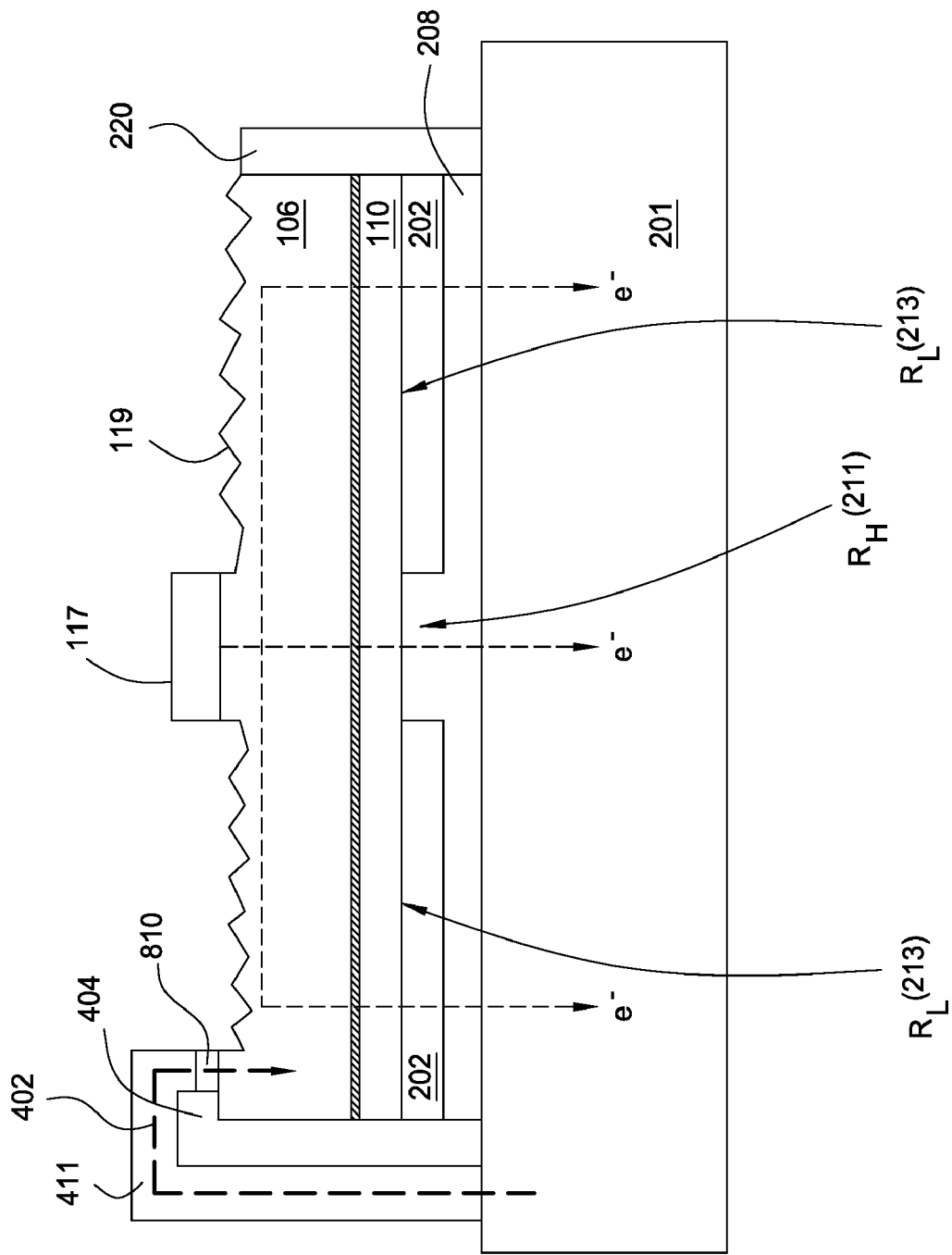
FIG. 9 illustrates an example LED device with a current guiding structure and a second current path with a protective device, in accordance with embodiments of the present invention.

For some embodiments, the current guiding structure described herein may be combined with a second current path as illustrated in FIGS. 6 and 9. This second current path is described in greater detail below, with reference to FIG. 4.

An Exemplary Second Current Path

Figure 4:
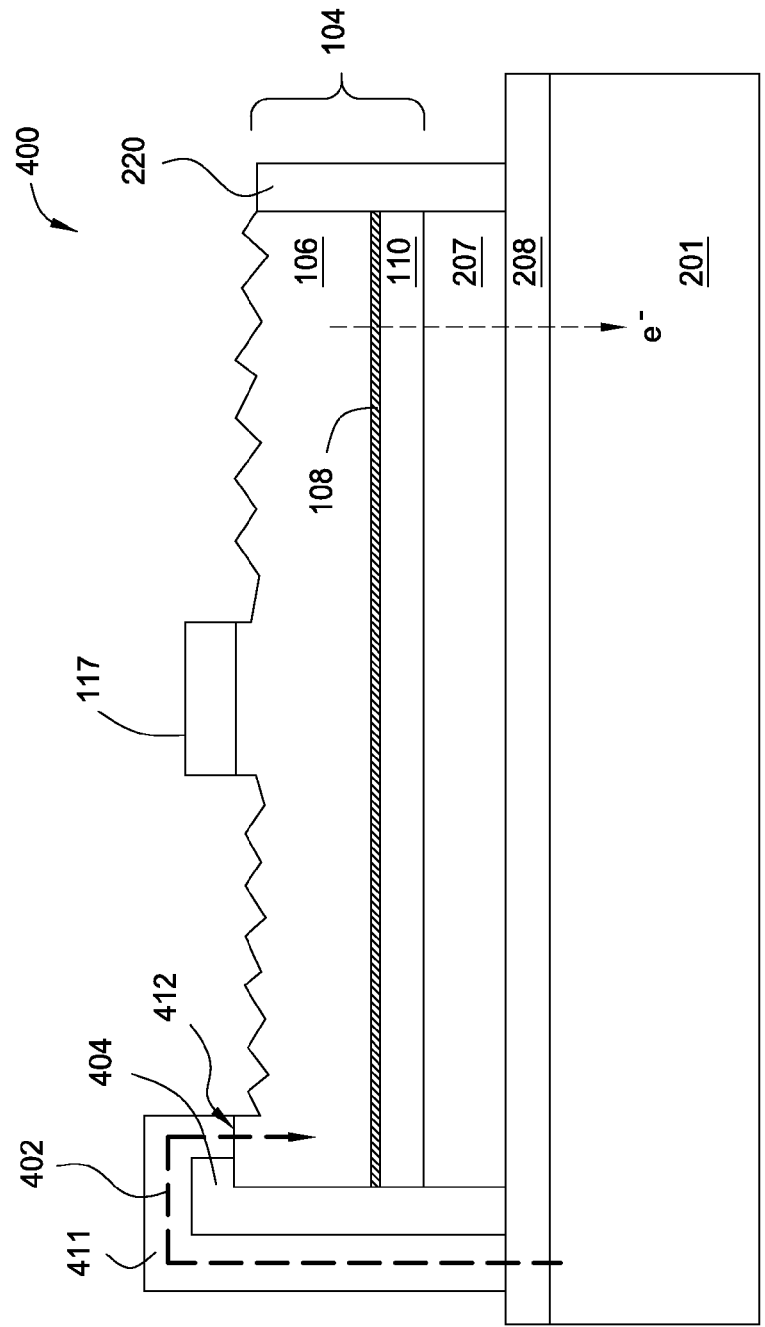
FIG. 4 illustrates an example LED device with a second current path in accordance with embodiments of the present invention.

FIG. 4 illustrates an example light-emitting diode (LED) device 400 with a second current path 402 in accordance with embodiments of the present invention. As illustrated, the LED device 400 may include a thermally and electrically conductive substrate 201, a p-electrode 207 disposed above the conductive substrate 201, an LED stack 104 disposed above the p-electrode 207, and an n-electrode 117 disposed above the LED stack 104. The LED stack 104 may include a heterojunction, which may comprise a p-type semiconductor layer 110, an active layer 108 for emitting light, and an n-type semiconductor layer 106. A second electrically conductive material 411 may be coupled to the conductive substrate 201 and to the n-type semiconductor layer 106 to form a non-ohmic contact 412 with n-type semiconductor layer 106 in an effort to provide a second current path 402 between the conductive substrate 201 and the n-semiconductor layer 106. The second conductive material 411 may be formed via any suitable process, such as e-beam deposition, sputtering, and/or printing.

As illustrated, an electrically insulative layer 404 may separate the second conductive material 411 and at least a portion of the LED stack 104. The insulative layer 404 may comprise any suitable electrically insulative material, such as $SiO_2$, $Si_3N_4$, $TiO_2$, $Al_2O_3$, $HfO_2$, $Ta_2O_5$, spin-on glass (SOG), MgO, polymer, polyimide, photoresistance, parylene, SU-8, and thermoplastic. For some embodiments, the protective layers 220 may serve as the insulative layer 404.

As described above, the conductive substrate 201 may be a single layer or multiple layers comprising metal or metal alloys, such as Cu, Ni, Ag, Au, Al, Cu—Co, Ni—Co, Cu—W, Cu—Mo, Ge, Ni/Cu and Ni/Cu—Mo. The thickness of the conductive substrate 201 may be about 10 to 400 μm.

Figure 5:
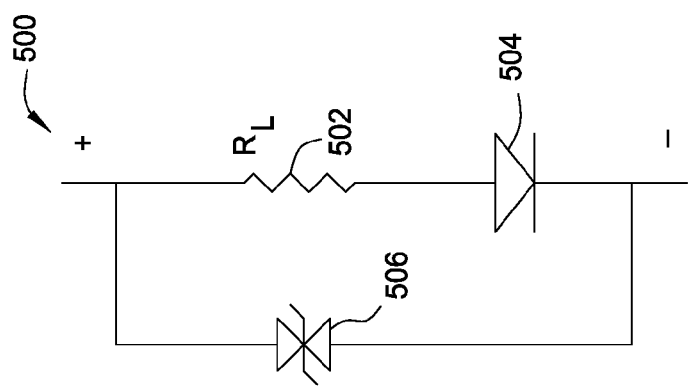
FIG. 5 illustrates an equivalent circuit to the LED device of FIG. 4.

FIG. 5 illustrates an equivalent circuit 500 for the LED device of FIG. 4. As illustrated, the equivalent circuit 500 includes two parallel current paths. The first current path includes an equivalent resistor $R_L$ 502 in series with an ideal LED 504 forming a forward current path from the conductive substrate 201 to the n-electrode 117. The second current path 402 is represented by a bidirectional transient voltage suppression (TVS) diode 506. The TVS diode 506 may operate similar to two opposing zener diodes connected in series and may serve to protect the resistor 502 and ideal LED 504 from high voltage transients. The TVS diode 506 can respond to over-voltages faster than other common over-voltage protection components (e.g., varistors or gas discharge tubes) making the TVS diode 506 useful for protection against very fast and often damaging voltage transients, such as electrostatic discharge (ESD). The second conductive material 411 of FIG. 4 may form the TVS diode 506 of FIG. 5. The second conductive material 411 may shunt excess current in either direction when the induced voltage exceeds the zener breakdown potential.

FIG. 6 illustrates another example LED device with a second current path 402 in accordance with embodiments of the present invention. As illustrated, an LED device with a second current path 402 may also include the current guiding structure resulting from separate high and low resistance contact areas 211, 213. For example, these different contact areas may be formed by the interjection of the reflective layer 202 by the barrier metal layer 208, as described above with respect to FIG. 2.

Figure 7:
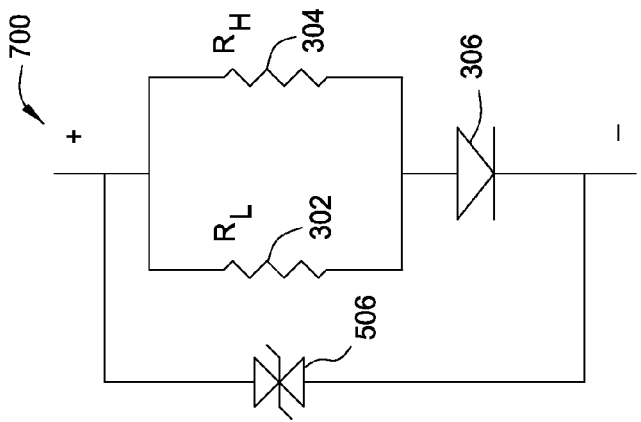
FIG. 7 illustrates an equivalent circuit to the LED device of FIG. 6.

FIG. 7 illustrates an equivalent circuit 700 to the LED device of FIG. 6. As illustrated, the single equivalent resistance $R_L$ 502 of FIG. 5 is replaced by the parallel combination of $R_H$ 304 and $R_L$ 302 to represent adjacent high and low contact resistance areas 211, 213 of FIG. 6. The remainder of the circuit 700 is equivalent to the circuit 500 of FIG. 5. In other words, the LED device of FIG. 6 may have the advantages of current guiding and transient suppression.

Figure 8:
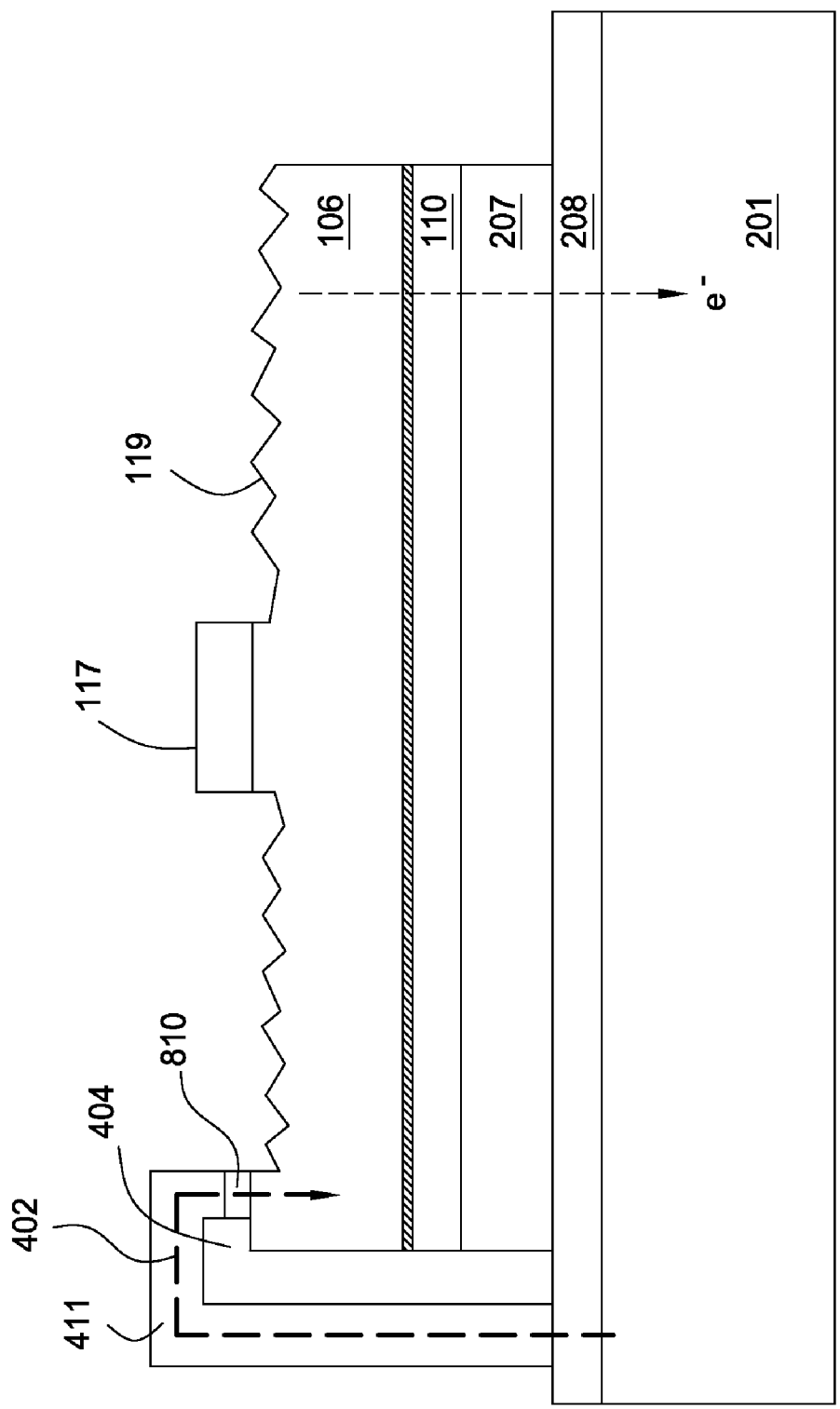
FIG. 8 illustrates an example LED device with a second current path with a protective device in accordance with embodiments of the present invention.

FIG. 8 illustrates another example LED device with a second current path 402 in accordance with embodiments of the present invention. In this embodiment, a protective device 810 is formed in the second current path 402. As illustrated, the protective device 810 may be formed on the n-type semiconductor layer 106 and may serve to increase the level of transient voltage protection or the current capability, thereby increasing the reliability and/or lifetime of the LED device. The protective device 810 may comprise any suitable material, such as ZnO, ZnS, $TiO_2$, NiO, $SrTiO_3$, $SiO_2$, $Cr_2O_3$, and polymethyl-methacrylate (PMMA). The thickness of the protective device 810 may range from about 1 nm to 10 μm.

As illustrated in FIG. 9, an LED device with a second current path 402 and a protective device 810, as shown in FIG.

8, may also include a current guiding structure resulting from separate high and low resistance contact areas 211, 213. For example, these different contact areas may be formed by the interjection of the reflective layer 202 by the barrier metal layer 208, as described above with respect to FIG. 2.

Figure 10:
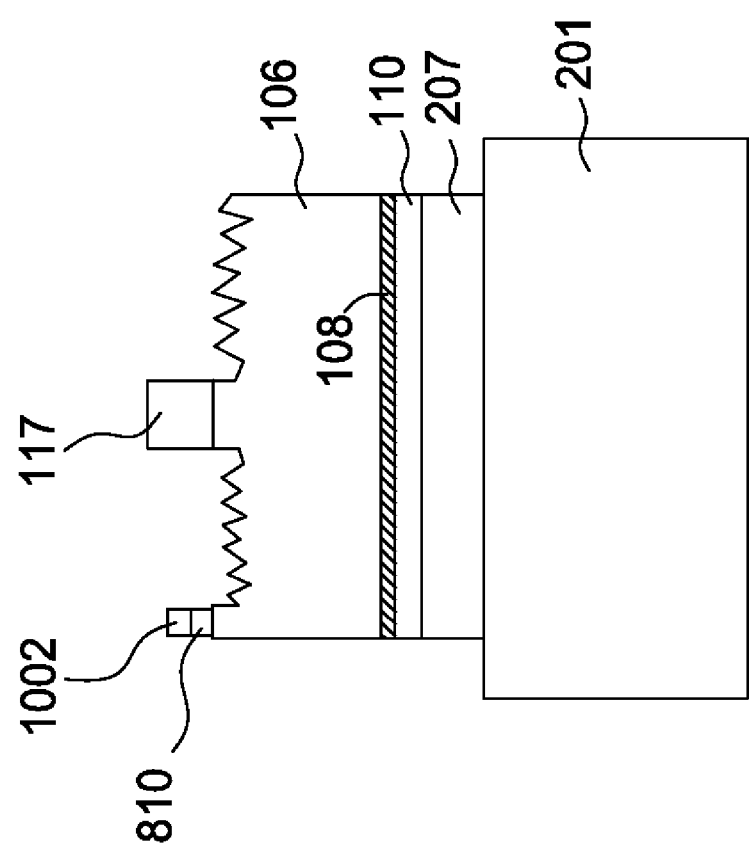
FIG. 10 illustrates an example LED device with a second current path, in chip form, in accordance with embodiments of the present invention.

FIG. 10 illustrates an example LED device with a second current path, in chip form, in accordance with embodiments of the present invention. As illustrated, a bonding metal layer 1002 may be deposited for electrical connection above the protective device 810 in the second current path. The bonding layer 1002 may comprise any suitable material for electrical connection, such as Al, Au, Ti/Au, Ti/Al, Ti/Pt/Au, Cr/Au, Cr/Al, Ni/Au, Ni/Al, or Cr/Ni/Au. The thickness of the bonding layer 1002 may range from 0.5 to 10 μm. For some embodiments, the n-electrode 117 may be extended to allow bonding to a package, as described below with respect to FIG. 11.

Figure 11:
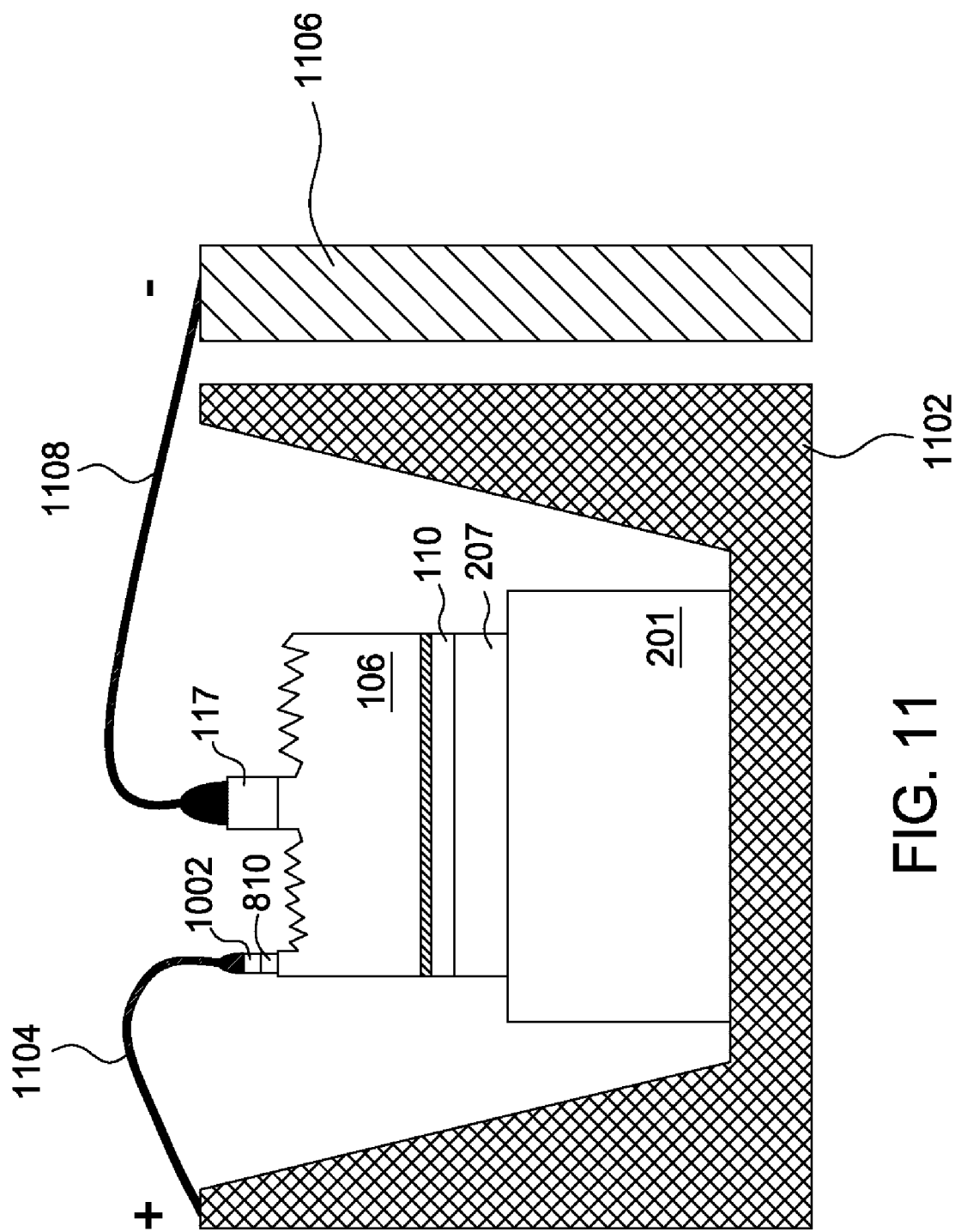
FIG. 11 illustrates an example LED device with a second current path, in package form, in accordance with embodiments of the present invention.

FIG. 11 illustrates the LED device of FIG. 10 in package form, in accordance with embodiments of the present invention. As illustrated, the conductive substrate 201 may be bonded to a common package anode lead 1102. The bonding layer 1002 may be coupled to the anode lead 1102 via a bonding wire 1104 attached to the bonding metal 1002, thereby forming the second current path. The n-electrode 117 may be coupled to a cathode package lead 1106 via another bonding wire 1108.

Figure 12:
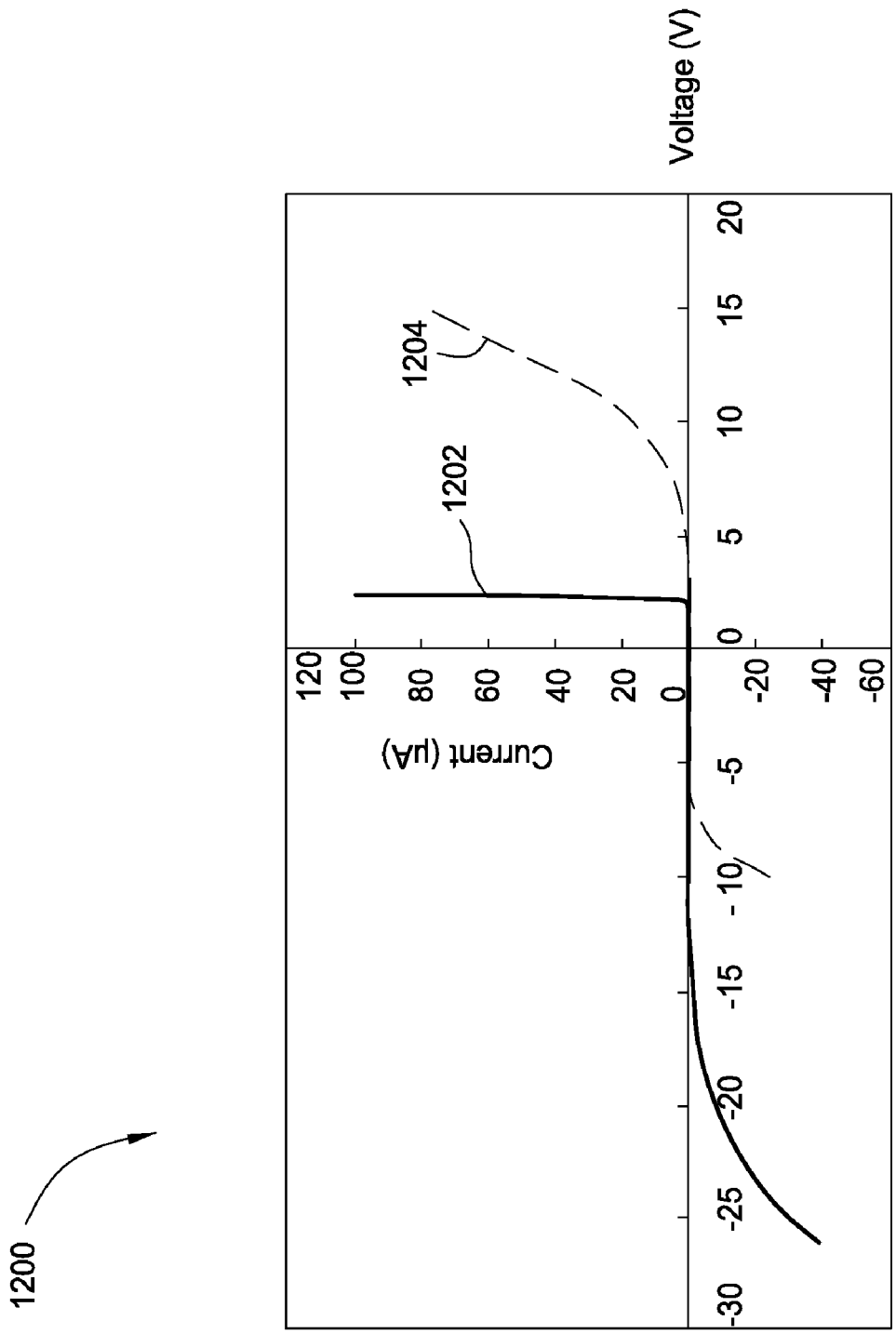
FIG. 12 illustrates an example current vs. voltage (I-V) graph comparing LED devices with and without a second current path.

FIG. 12 is a graph 1200 plotting example I-V curves 1204, 1202 of an LED device with and without a second current path, respectively. As illustrated by the I-V curve 1204, the second current path may allow an LED device to withstand higher voltage without an excessive amount of current, which may prevent damage and/or prolong device life.

Figure 13:
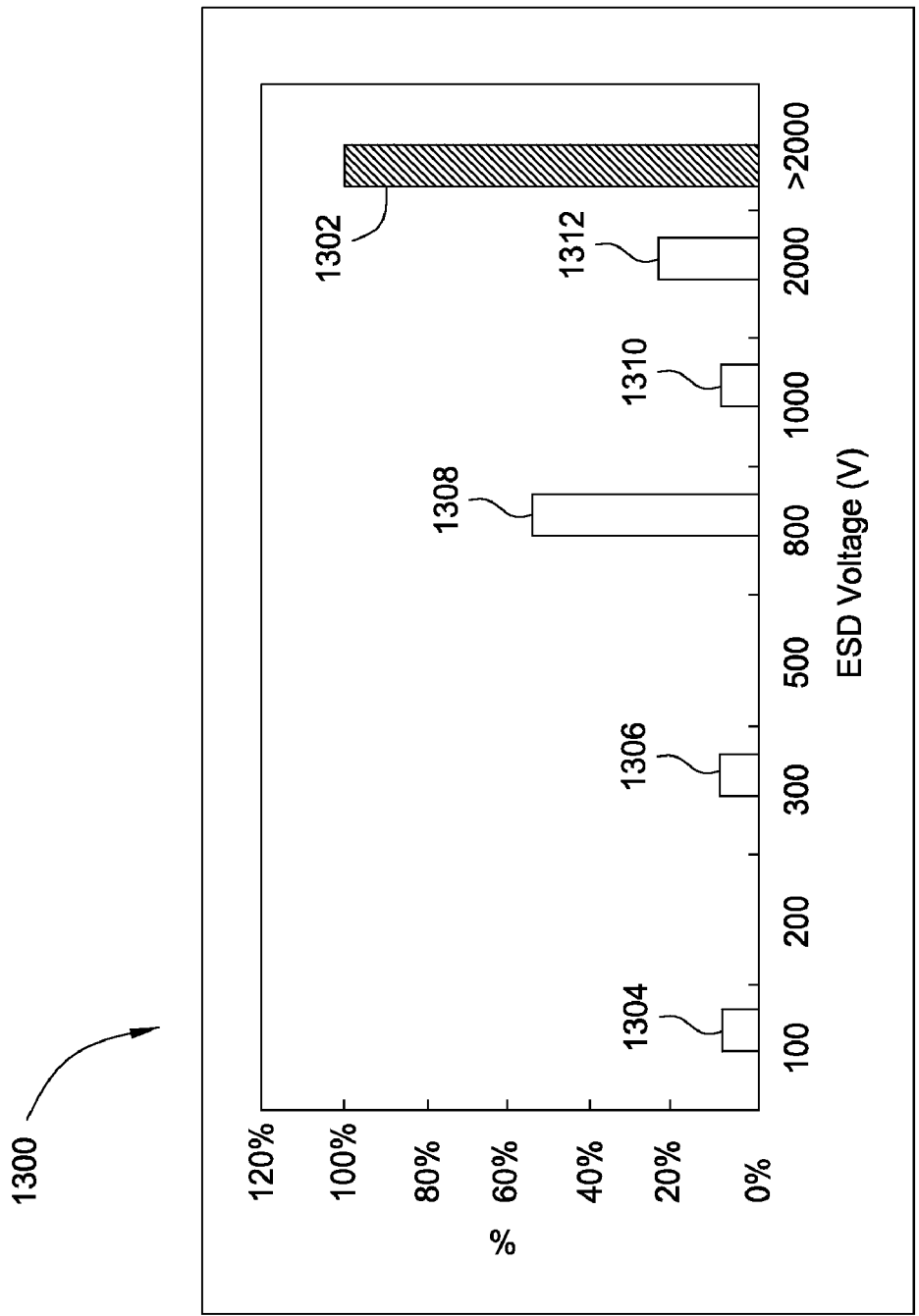
FIG. 13 illustrates an example graph of electrostatic discharge (ESD) level and corresponding survival rate of LED devices with and without a second current path.

FIG. 13 illustrates an example graph 1300 of ESD voltage and corresponding survival rate of LED devices with and without a second current path. In the illustrated scenario, LED devices 1304, 1306, 1308, 1310, 1312 without a second current path pass the test with various survival rates at various ESD voltages. In contrast, LED devices 1302 with the second current path pass at a rate at or near 100%, even at higher ESD voltage levels greater than 2000 V.

While the current guiding structures described herein have advantages that apply to vertical light-emitting device (VLED) devices, those skilled in the art will recognize that such advantages generally apply to most semiconductor devices. Therefore, the structures described herein may be used to advantage to form low resistance contacts and/or transient suppressors for any type of semiconductor device having a p-n junction.

While the foregoing is directed to embodiments of the present invention, other and further embodiments of the invention may be devised without departing from the basic scope thereof, and the scope thereof is determined by the claims that follow.

The invention claimed is:

1. A light-emitting diode (LED), comprising:
a metal substrate;
an LED stack for emitting light disposed above the metal substrate, wherein the LED stack comprises a p-type semiconductor layer and an n-type semiconductor layer;
an n-electrode disposed above the n-type semiconductor layer;
a protective device disposed above the n-type semiconductor; and
an electrically conductive material coupled between the metal substrate and the protective device.

2. The LED according to claim 1, wherein the protective device comprises at least one of ZnO, ZnS, TiO$_2$, NiO, SrTiO$_3$, SiO$_2$, Cr$_2$O$_3$, or polymethyl-methylacrylate (PMMA).

3. The LED according to claim 1, wherein the thickness of the protective device is in a range from 1 nm to 10 μm.

4. The LED according to claim 1, further comprising a p-electrode interposed between the metal substrate and the LED stack, wherein the p-electrode comprises first and second contacts, the first contact having a higher resistance than the second contact.

5. The LED according to claim 4, wherein the p-electrode comprises an omni-directional reflective (ODR) system.

6. The LED according to claim 1, wherein the conductive material comprises multiple metal layers.

7. The LED according to claim 1, wherein the conductive material comprises at least one of Ni, Ag, Au, Al, Mo, Pt, W, W—Si, Ta, Ti, Hf, Ge, Mg, Zn, W/Au, Ta/Au, Pt/Au, Ti/Au, Ti/Al, Ti/Pt/Au, Ti/Ni/Au, Ta/Pt/Au, W—Si/Au, Cr/Au, Cr/Al, Ni/Au, Ni/Al, Cr/Ni/Au, Cr/W/Au, Cr/W—Si/Au, Cr/Pt/Au, AuGe, AuZn, indium tin oxide (ITO), indium zinc oxide (IZO), or Ni/Cu.

8. The LED according to claim 1, further comprising an electrically insulative material between the LED stack and the conductive material.

9. The LED according to claim 8, wherein the insulative material comprises at least one of SiO$_2$, Si$_3$N$_4$, TiO$_2$, Al$_2$O$_3$, HfO$_2$, Ta$_2$O$_5$, spin-on glass (SOG), MgO, polymer, polyimide, photoresistance, parylene, SU-8, or thermoplastic.

10. The LED of claim 1, further comprising a bonding layer interposed between the conductive material and the protective device.

11. The LED of claim 10, wherein the conductive material is a wire coupled between the metal substrate and the bonding layer.

12. The LED according to claim 10, wherein the bonding layer comprises multiple metal layers.

13. The LED according to claim 10, wherein the bonding layer comprises at least one of Ti/Au, Ti/Al, Ti/Pt/Au, Cr/Au, Cr/Al, Al, Au, Ni/Au, Ni/Al, or Cr/Ni/Au.

14. The LED according to claim 10, wherein the thickness of the bonding layer is in a range from 0.5 to 10 μm.

15. The LED according to claim 1, wherein a surface of the n-type semiconductor layer is patterned or roughened in an effort to increase light extraction from the LED.

16. A light-emitting diode (LED), comprising:
a metal substrate;
a p-electrode disposed above the metal substrate and having first and second contacts, wherein the first contact has a higher electrical resistance than the second contact;
an LED stack for emitting light disposed above the p-electrode, wherein the LED stack comprises a p-type semiconductor layer coupled to the p-electrode and an n-type semiconductor layer; and
an n-electrode disposed above the n-type semiconductor layer.

17. The LED according to claim 16, wherein the first contact comprises a barrier metal layer.

18. The LED according to claim 16, wherein the first contact comprises multiple metal layers.

19. The LED according to claim 16, wherein the first contact comprises at least one of Pt, tantalum (Ta), tungsten (W), W—Si, Ni, Cr/Ni/Au, W/Au, Ta/Au, Ni/Au, Ti/Ni/Au, W—Si/Au, Cr/W/Au, Cr/W—Si/Au, Pt/Au, Cr/Pt/Au, or Ta/Pt/Au.

20. The LED according to claim 16, wherein the second contact comprises a reflective layer.

21. The LED according to claim 16, wherein the second contact comprises at least one of silver (Ag), gold (Au), aluminum (Al), Ag—Al, Mg/Ag, Mg/Ag/Ni/, Mg/Ag/Ni/Au, AgNi, Ni/Ag/Ni/Au, Ag/Ni/Au, Ag/Ti/Ni/Au, Ti/Al, Ni/Al, AuBe, AuGe, AuPd, AuPt, AuZn, indium tin oxide (ITO), indium zinc oxide (IZO), or an alloy containing at least one of Ag, Au, Al, nickel (Ni), magnesium (Mg), chromium (Cr), platinum (Pt), palladium (Pd), rhodium (Rh), or copper (Cu).

22. The LED according to claim 16, wherein the p-electrode comprises an omni-directional reflective (ODR) system.

23. The LED according to claim 16, wherein an area of the second contact is larger than an area of the first contact resistance.

24. The LED according to claim 16, wherein the first contact is disposed in a voided space of the second contact.

25. The LED according to claim 16, wherein the resistance of the first contact is at least double the resistance of the second contact.

26. The LED according to claim 16, wherein the thickness of the metal substrate is in a range from 10 to 400 µm.

27. The LED according to claim 16, wherein the LED is a vertical light-emitting diode (VLED).

* * * * *